(12) United States Patent
Yoshisato et al.

(10) Patent No.: US 6,664,862 B2
(45) Date of Patent: Dec. 16, 2003

(54) OSCILLATOR WITH CONSTANT OUTPUT LEVEL OVER OSCILLATION FREQUENCY RANGE

(75) Inventors: Akiyuki Yoshisato, Fukushima-ken (JP); Kazuhiko Ueda, Fukushima-ken (JP); Hiroaki Kukita, Kanagawa-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 151 days.

(21) Appl. No.: 09/902,347

(22) Filed: Jul. 10, 2001

(65) Prior Publication Data

US 2002/0008592 A1 Jan. 24, 2002

(30) Foreign Application Priority Data

Jul. 11, 2000  (JP) ........................................ 2000-215827

(51) Int. Cl.[7] .................................................. H03B 5/18
(52) U.S. Cl. .............................. 331/108 R; 331/108 A; 331/117 FE
(58) Field of Search .............................. 331/75, 117 R, 331/117 D, 177 V, 108 R, 108 C, 114, 107 T, 107 SZ, 109

(56) References Cited

U.S. PATENT DOCUMENTS

| | | | | |
|---|---|---|---|---|
| 5,187,451 A | * | 2/1993 | Nakamoto et al. | 331/117 D |
| 5,379,003 A | * | 1/1995 | Bizen | 331/117 R |
| 5,440,276 A | * | 8/1995 | Kim | 331/117 FE |
| 5,905,414 A | * | 5/1999 | Motoi | 331/117 D |
| 6,008,702 A | * | 12/1999 | Yamamoto | 331/179 |
| 6,060,954 A | * | 5/2000 | Liu et al. | 331/117 D |
| 6,188,295 B1 | * | 2/2001 | Tsai | 331/117 D |

FOREIGN PATENT DOCUMENTS

JP            6-085536            3/1994

* cited by examiner

*Primary Examiner*—Tuan T. Lam
(74) *Attorney, Agent, or Firm*—Brinks Hofer Gilson & Lione

(57) ABSTRACT

An oscillator includes an oscillation circuit unit and an amplification circuit unit of the common-base type. The oscillation circuit unit includes an oscillation transistor and a resonance circuit, the collector of the oscillation transistor being grounded via a first capacitor. The amplification circuit unit includes an amplification transistor, the emitter thereof being directly connected to the collector of the oscillation transistor and the base thereof being grounded via a second capacitor. The resonance circuit is connected between the base of the oscillation transistor and the ground. An oscillation signal output from the collector of the oscillation transistor is input to the emitter of the amplification transistor while partially being bypassed to the ground via the first capacitor. Negative feedback is provided to the amplification transistor in association with the second capacitor.

19 Claims, 2 Drawing Sheets

OSCILLATOR WITH CONSTANT OUTPUT LEVEL OVER OSCILLATION FREQUENCY RANGE

BACKGROUND OF THE INVENTION

1. Field of the Invention

The present invention relates to oscillators, and more particularly to an oscillator including an oscillation circuit unit and an amplification circuit unit for amplifying an oscillation signal output from the oscillation circuit unit.

2. Description of the Related Art

FIG. 2 is a circuit diagram of a conventional oscillator. Referring to FIG. 2, an oscillation circuit unit 40 includes an oscillation transistor 41 and a resonance circuit 42. The collector of the oscillation transistor 41 is grounded via a ground capacitor 43 in the high-frequency range (i.e. at high frequencies), and the emitter thereof is grounded via an emitter bias resistor 44. Furthermore, capacitors 45 and 46 are connected for feedback purposes between the base and the emitter and between the emitter and the ground, respectively.

The resonance circuit 42 is implemented by a two-port circuit including a resonance line 42a implemented by a microstrip line, a varactor diode 42b, etc. One end of the resonance line 42a and the anode of the varactor diode 42b are grounded, and the other end of the resonance line 42a is connected to the base of the oscillation transistor 41 via a coupling capacitor 42c and to the cathode of the varactor diode 42b via a DC blocking capacitor 42d. Thus, the oscillation circuit unit 40 constitutes an oscillation circuit of the common-collector type.

The cathode of the varactor diode 42b is connected to a control terminal 48 via a choke inductor 47. The control terminal 48 is grounded via a ground capacitor 49 in the high-frequency range. A voltage for changing the capacitance of the varactor diode 42b is applied to the control terminal 48.

An amplification circuit unit 50 includes an amplification transistor 51, the emitter thereof being connected to the collector of the oscillation transistor 41, and the collector thereof being connected to a power supply terminal 53 via an inductor 52. A voltage Vb is applied to the power supply terminal 53. The power supply terminal 53 is grounded via a ground capacitor 54 in the high-frequency range. The collector is grounded via a capacitor 55, and connected to an output terminal 57 via an output matching circuit formed by the inductor 52 and a coupling capacitor 56.

In association with base bias resistors 58, 59, and 60 connected in series between the power supply terminal 53 and the ground, bias voltages are applied to the bases of the oscillation transistor 41 and the amplification transistor 51. Thus, a common bias current flows into the oscillation transistor 41 and the amplification transistor 51. Thus, the amplification circuit unit 50 constitutes an amplification circuit of the common-emitter type.

A coupling capacitor 61 is connected between the emitter of the oscillation transistor 41 and the base of the amplification transistor 51, so that an oscillation signal is input to the base of the amplification transistor 51.

The oscillation frequency changes according to the voltage applied to the control terminal 48.

In the above-described conventional oscillator, the emitter of the oscillation transistor 41 is connected to the base of the amplification transistor 51 via the coupling capacitor 61. Since the reactance of the coupling capacitor 61 depends on frequency, the level of the oscillation signal input to the base of the amplification transistor 51 is higher when the oscillation frequency is high and lower when the oscillation frequency is low.

Thus, the level of the oscillation signal output from the amplification circuit unit 50 also changes depending on the oscillation frequency. It would be desirable to provide an oscillator having a substantially constant level of oscillation signal over the entire range of oscillation frequencies.

SUMMARY OF THE INVENTION

Accordingly, an object of the present invention is to provide an oscillator in which the level of the oscillation signal is substantially constant over the entire oscillation frequency range.

To this end, the present invention provides an oscillator comprising an oscillation circuit unit having an oscillation transistor and a resonance circuit, the collector of the oscillation transistor being grounded via a first capacitor; and an amplification circuit unit of the common base type, having an amplification transistor, the emitter of the amplification transistor being directly connected to the collector of the oscillation transistor, and the base of the amplification transistor being grounded via a second capacitor. The resonance circuit is connected between the base of the oscillation transistor and the ground, an oscillation signal output from the collector of the oscillation transistor is input to the emitter of the amplification transistor while partially being bypassed to the ground via the first capacitor, and a negative feedback is provided to the amplification transistor in association with the second capacitor.

Thus, the level of the oscillation signal output from the amplification circuit unit is substantially constant even if the oscillation frequency changes.

Preferably, the reactance of each of the first capacitor and the second capacitor is in a range of a few ohms to dozens of ohms at the oscillation frequency.

Thus, the level of the oscillation signal-input to the emitter of the amplification transistor is maintained sufficiently high while a sufficient gain is provided in the amplification circuit unit.

More preferably, the reactance of either the first capacitor or the second capacitor is within three times the reactance of the other.

Thus, substantial flatness is achieved in the level of the oscillation signal over the oscillation frequency range.

More preferably, the reactance of the first capacitor is larger than the reactance of the second capacitor.

Thus, the level of higher harmonics input to the amplification circuit unit is decreased.

More preferably, the oscillation circuit unit oscillates in a range of approximately 3.5 GHz to 3.9 GHz, the capacitance of the first capacitor is approximately 2 pF, and the capacitance of the second capacitor is approximately 4 pF.

Thus, the level of the oscillation signal output from the oscillation circuit unit is substantially constant in the oscillation frequency range of 3.5 GHz to 3.9 GHz.

DESCRIPTION OF THE PREFERRED EMBODIMENTS

Figure 1:
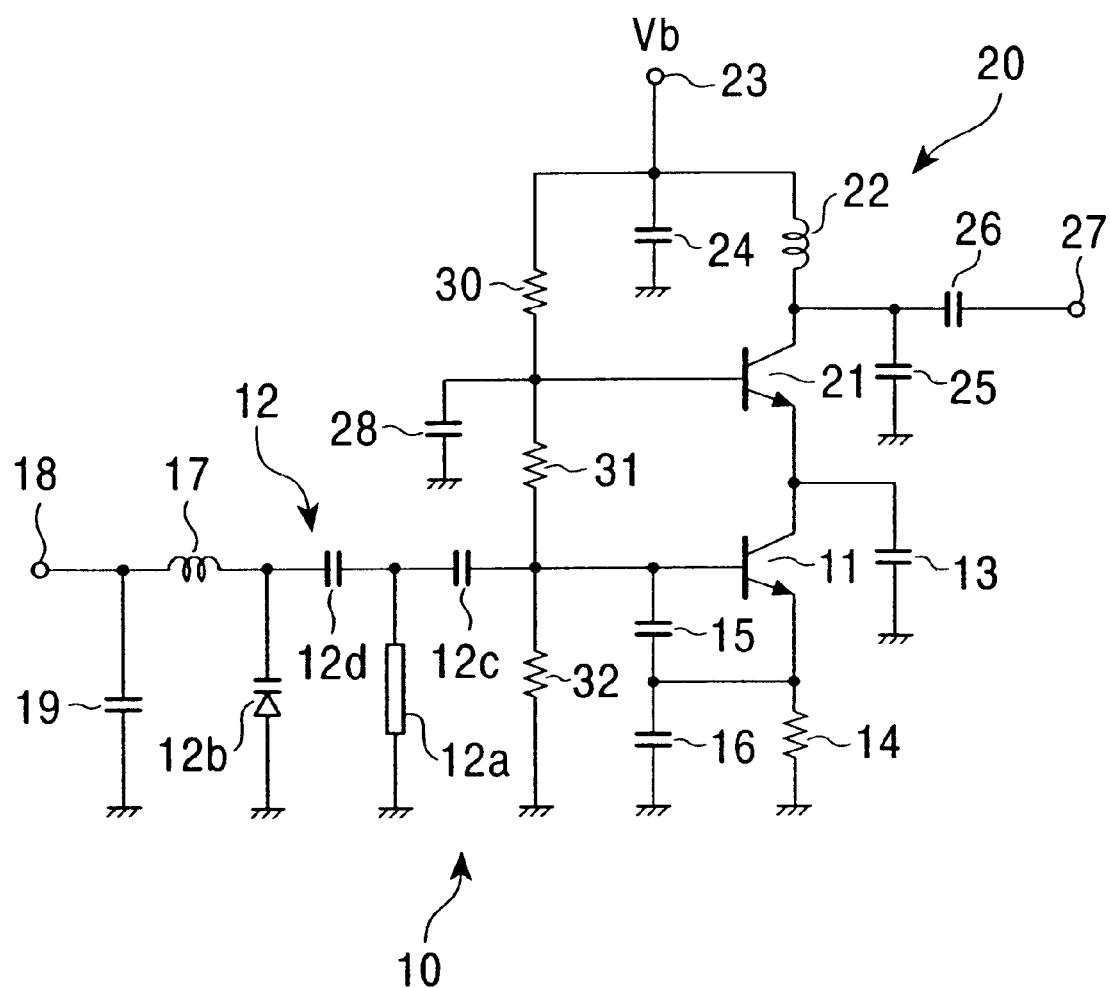
FIG. 1 is a circuit diagram of an oscillator according to an embodiment of the present invention.
Figure 2:
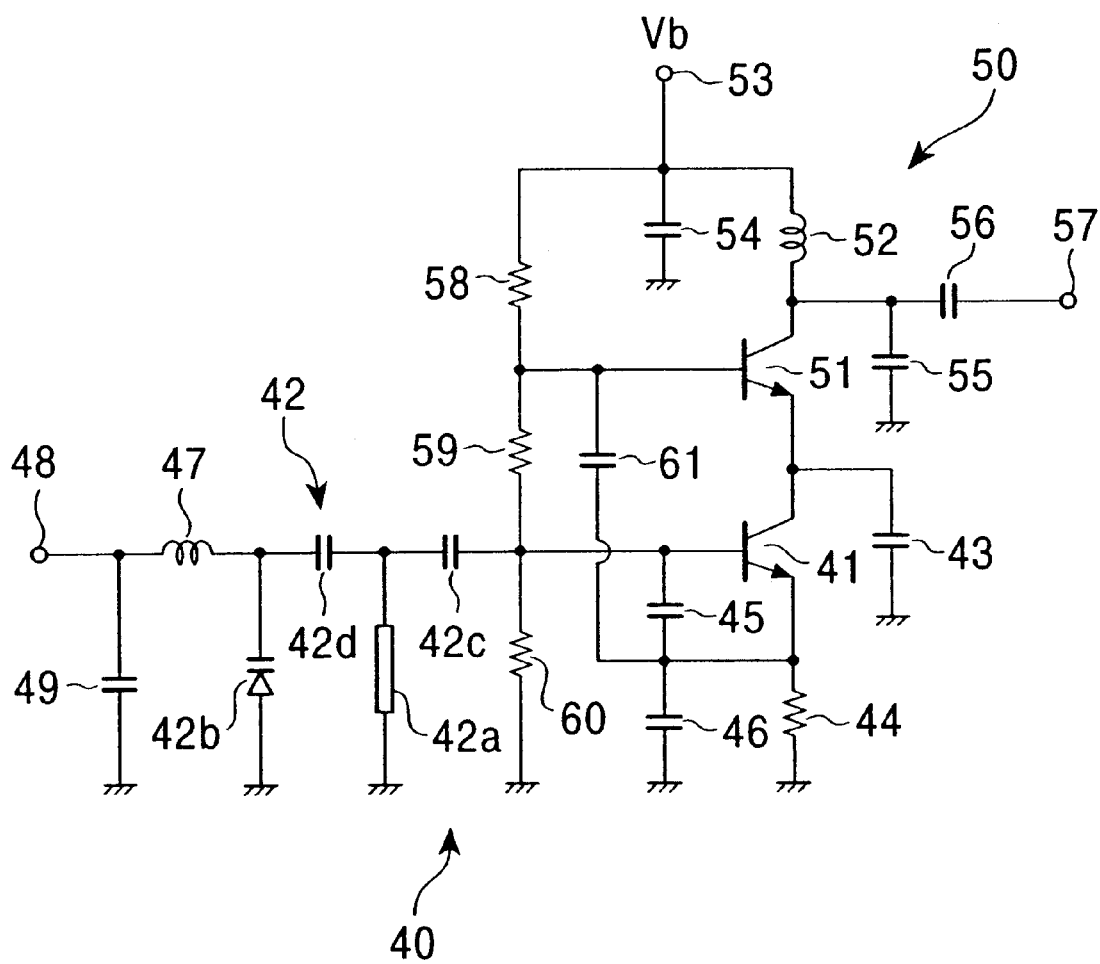
FIG. 2 is a circuit diagram of a conventional oscillator.

FIG. 1 is a circuit diagram of an oscillator according to an embodiment of the present invention. Referring to FIG. 1, an oscillation circuit unit 10 includes an oscillation transistor 11 and a resonance circuit 12, the resonance circuit 12 being connected between the base of the oscillation transistor 11 and the ground. The collector of the oscillation transistor 11 is grounded via a first capacitor 13, and the emitter thereof is grounded via an emitter bias resistor 14. Furthermore, capacitors 15 and 16 connected between the base and the emitter and between the emitter and the ground, respectively, provide feedback for the oscillation transistor 11.

The capacitance value of the first capacitor 13 provides a reactance that allows the oscillation circuit unit 10 to oscillate in the common-collector mode and to output an oscillation signal from the collector. Thus, the collector is not fully grounded in the high-frequency range, but rather, floats above ground.

The resonance circuit 12 is implemented by a two-port circuit including a resonance line 12a (for example, a microstrip line), a varactor diode 12b, etc. One end of the resonance line 12a and the anode of the varactor diode 12b are grounded, and the other end of the resonance line 12a is connected to the base of the oscillation transistor 11 via a coupling capacitor 12c and also connected to the cathode of the varactor diode 12b via a DC blocking capacitor 12d.

The cathode of the varactor diode 12b is connected to a control terminal 18 via a choke inductor 17. The control terminal 18 is grounded via a ground capacitor 19 in the high-frequency range. A voltage that changes the capacitance of the varactor diode 12b is applied to the control terminal 18.

An amplification circuit unit 20 includes an amplification transistor 21, the emitter thereof being directly connected to the collector of the oscillation transistor 11, and the collector thereof being connected to a power supply terminal 23 via an inductor 22. The power supply terminal 23 is grounded via a ground capacitor 24 in the high-frequency range. A power supply voltage Vb is applied to the power supply terminal 23. The collector is grounded via a capacitor 25 that effects impedance matching, and connected to an output terminal 27 via an output matching circuit that includes the inductor 22 and a coupling capacitor 26.

Furthermore, the base is grounded via a second capacitor 28, the amplification circuit unit 20 thus constituting an amplification circuit of the common-base type. However, the base of the amplification transistor 21 is not fully grounded in the high-frequency range, but rather floats above ground.

In association with base bias resistors 31, 32, and 33 connected in series between the power supply terminal 23 and the ground, bias voltages are applied to the bases of the oscillation transistor 11 and the amplification transistor 21. Thus, a common bias current flows into the oscillation transistor 11 and the amplification transistor 21.

The oscillation frequency changes approximately from 3.5 GHz to 3.9 GHz depending on the voltage applied to the control terminal 18.

In accordance with the construction as described above, the capacitance value of the first capacitor 13 provides a reactance such that the collector of the oscillation transistor 11 is not fully grounded in the high-frequency range, thereby allowing the oscillation signal to be input to the emitter of the amplification transistor 21 and permitting the oscillation circuit unit 10 to operate in a similar manner as an oscillation circuit of the common-collector type. Thus, the oscillation signal output from the collector is input to the emitter of the amplification transistor 21 while partially being bypassed to the ground via the first capacitor.

Thus, the level of the oscillation signal input to the emitter of the amplification circuit 21 depends on the capacitance value of the first capacitor 13. Also, the level is lower when the oscillation frequency is high, and higher when the oscillation frequency is low.

The capacitance value of the second capacitor 28 provides a reactance such that the amplification transistor 21 substantially receives negative feedback. Thus, one means for providing negative feedback is the second capacitor 28. When the oscillation frequency is high, the level of the negative feedback is lower, thus the gain in the amplification circuit unit 20 is larger; whereas when the oscillation frequency is low, the gain is smaller. The level of the negative feedback also depends on the capacitance value of the second capacitor 28. Accordingly, the level of the oscillation signal output from the amplification circuit unit 20 is substantially flat over the entire oscillation frequency range as the effects from the first capacitor 13 and the second capacitor 28 balance each other.

The capacitance values of the first capacitor 13 and the second capacitor 28 provide reactance in a range of approximately a few ohms to dozens of ohms considering the input impedance of the emitter and the base of the amplification transistor 21. If the reactance is lower than a few ohms, the level of the oscillation signal input to the amplification transistor 21 is not sufficiently high, whereas if the reactance is higher than dozens of ohms, the level of the negative feedback in the amplification circuit unit 21 is too high, failing to provide a sufficient gain.

Furthermore, when the reactance of either the first capacitor 13 or the second capacitor 28 is within three times the reactance of the other, flatness of response is achieved even though the level of the oscillation signal itself changes depending on the oscillation frequency.

Furthermore, when the capacitance values of the first capacitor 13 and the second capacitor 28 have values such that the reactance of the first capacitor 13 is larger than the reactance of the second capacitor 28, for example, the capacitance value of the first capacitor 13 is approximately 2 pF, and the capacitance value of the second capacitor 28 is approximately 4 pF, the level of higher harmonics input to the amplification circuit unit 20 is decreased, and the level of the oscillation signal output from the amplification circuit unit 20 is substantially constant in the oscillation frequency range of 3.5 GHz to 3.9 GHz.

Alternatively, rather than the second capacitor 28, being used as a source of negative feedback for the amplification transistor, a circuit or other circuit element(s) providing an equivalent reactance (and therefore the appropriate negative feedback) at the frequency of oscillation may be used. Similarly, a different circuit or other circuit element(s) may be used to provide the necessary reactance to the oscillation transistor. The above circuit or circuits that replace the first and second capacitors 13, 28 should have characteristics such that the reactances of the respective circuits have the appropriate parameters (e.g. ratios, values) mentioned above for the first and second capacitors 13, 28.

While the invention has been described with reference to specific embodiments, the description is illustrative of the invention and not to be construed as limiting the invention. Various modifications and applications may occur to those skilled in the art without departing from the true spirit and scope of the invention as defined in the appended claims.

What is claimed is:

1. An oscillator comprising:

an oscillation circuit unit including an oscillation transistor and a resonance circuit, and including a first capacitor connected between a collector of said oscillation transistor and ground; and an amplification circuit unit of a common base type, including an amplification transistor, an emitter of said amplification transistor being directly connected to the collector of said oscillation transistor, and a base of said amplification transistor being grounded via a second capacitor;

wherein said resonance circuit is connected between a base of said oscillation transistor and ground, an oscillation signal output from the collector of said oscillation transistor is input to an emitter of said amplification transistor, a negative feedback is provided to said amplification transistor in association with said second capacitor, a reactance of one of said first capacitor and said second capacitor is within three times a reactance of the other of said first capacitor and said second capacitor.

2. An oscillator according to claim 1, wherein the reactance of each of said first capacitor and said second capacitor is in a range of a few ohms to dozens of ohms at an oscillation frequency of the oscillator.

3. An oscillator according to claim 2, wherein the reactance of said first capacitor is larger than the reactance of said second capacitor.

4. An oscillator according to claim 1, wherein the reactance of said first capacitor is larger than the reactance of said second capacitor.

5. An oscillator according to claim 3, wherein said oscillation circuit unit oscillates in a range of approximately 3.5 GHz to 3.9 GHz, a capacitance of said first capacitor is approximately 2 pF, and a capacitance of said second capacitor is approximately 4 pF.

6. An oscillator according to claim 4, wherein said oscillation circuit unit oscillates in a range of approximately 3.5 GHz to 3.9 GHz, a capacitance of said first capacitor is approximately 2 pF, and a capacitance of said second capacitor is approximately 4 pF.

7. An oscillator comprising:

an amplification transistor;

an oscillation transistor that supplies an oscillation signal to the amplification transistor;

a first reactance circuit connected between a node between the oscillation transistor and the amplification transistor and ground; and a second reactance circuit that supplies negative feedback to the amplification transistor and maintains a constant level of the oscillation signal, the reactances of the first and second reactance circuits within a factor of three of each other.

8. The oscillator of claim 7, the second reactance circuit grounding a base of the amplification transistor.

9. The oscillator of claim 7, the collector of the oscillation transistor forming the connection between the oscillation transistor and the amplification transistor.

10. The oscillator of claim 9, the connection between the oscillation transistor and the amplification transistor formed by the collector of the oscillation transistor forming in combination with an emitter of the amplification transistor.

11. The oscillator of claim 10, the amplification transistor having a common base configuration in which the second reactance circuit is connected with a base of the amplification transistor.

12. The oscillator of claim 11, an oscillation circuit unit incorporating the oscillation transistor, the oscillation circuit unit further comprising a resonance circuit connected between a base of the oscillation transistor and ground.

13. The oscillator of claim 12, the second reactance circuit grounding a base of the amplification transistor.

14. An oscillator according to claim 13, a reactance of each of the first reactance circuit and second reactance circuit in a range of a few ohms to dozens of ohms at the oscillation frequency.

15. An oscillator according to claim 13, a reactance of the first reactance circuit larger than a reactance of the second reactance circuit.

16. An oscillator according to claim 13, the oscillation frequency in a range of approximately 3.5 GHz to 3.9 GHz, an effective capacitance of the first reactance circuit is approximately 2 pF, and an effective capacitance of the second reactance circuit is approximately 4 pF.

17. A method of maintaining a constant oscillation signal level for an oscillator having an oscillation frequency, the method comprising:

supplying a signal output from an oscillation transistor and to an amplification transistor;

capacitively coupling a collector of the oscillation transistor with groundusing a first capacitor having a first reactance;

capacitively coupling a base of the amplification transistor with ground using a second capacitor having a second reactance and providing negative feedback to the amplification transistor; and limiting the first reactance and the second reactance as determined at the oscillation frequency to within about three times of each other.

18. The method of claim 17, further comprising limiting a reactance of each of the capacitive couplings of the oscillation and amplification transistors at the oscillation frequency to between about two ohms and about 50 ohms.

19. The method of claim 17, further comprising further limiting the reactance of the capacitive coupling of the oscillation transistor to be larger than the reactance of the capacitive coupling of the amplification transistor.

* * * * *